United States Patent [19]
Laity

[11] Patent Number: 6,115,257
[45] Date of Patent: *Sep. 5, 2000

[54] PCMCIA CARD FRAME, CONNECTOR AND COVER ASSEMBLY

[75] Inventor: Ian A. Laity, Simi Valley, Calif.

[73] Assignee: Xircom, Inc., Thousand Oaks, Calif.

[ * ] Notice: This patent is subject to a terminal disclaimer.

[21] Appl. No.: 09/350,195

[22] Filed: Jul. 9, 1999

Related U.S. Application Data

[63] Continuation of application No. 08/910,942, Aug. 8, 1997, Pat. No. 5,940,275.

[51] Int. Cl.$^7$ ................................................... H05K 1/14
[52] U.S. Cl. .................... 361/737; 361/736; 361/737; 361/818; 361/816; 439/76.1; 439/101; 439/108; 439/607; 439/609; 439/946
[58] Field of Search ..................... 361/737, 816, 361/818; 439/76.1, 946, 101, 108, 607, 609

[56] References Cited

U.S. PATENT DOCUMENTS

| | | | |
|---|---|---|---|
| 5,244,397 | 9/1993 | Anhaft | 439/101 |
| 5,319,516 | 6/1994 | Perkins | 361/220 |
| 5,470,237 | 11/1995 | Byczek et al. | 439/46.1 |
| 5,478,260 | 12/1995 | Kaufman et al. | 439/609 |
| 5,529,503 | 6/1996 | Kerklaan | 349/76.1 |
| 5,696,669 | 12/1997 | Bassker et al. | 361/816 |
| 5,807,137 | 9/1998 | Janota et al. | 439/607 |
| 5,833,473 | 11/1998 | Betker et al. | 439/76.1 |

*Primary Examiner*—Hyung-Sub Sough
*Assistant Examiner*—Tuan Dinh
*Attorney, Agent, or Firm*—Hogan & Hartson L.L.P.

[57] ABSTRACT

A PCMCIA card structure includes a front connector, a frame, a substrate, and a sheet metal cover having a top cover panel. A ground plate having rearwardly extending ground contacts is carried on the upper surface of the connector. The frame includes an insulative cross beam disposed adjacent to the rear of the connector, the cross beam serving to support the top cover panel of the card, to prevent the top cover panel from contacting the connector ground plate or the contacts extending from the ground plate, and, along with portions of the ground plate, to close off the space between the connector and the front edge of the top cover panel. The ground plate has a transverse length shorter than that of the connector, thereby defining end shoulder surfaces along the upper surface of the connector. The top cover panel includes a pair of laterally spaced, forwardly extending tabs, each tab overlying an end shoulder surface on the connector.

4 Claims, 9 Drawing Sheets

PCMCIA CARD FRAME, CONNECTOR AND COVER ASSEMBLY

This is a continuation of application Ser. No. 08/910,942 filed Aug. 8, 1997 now U.S. Pat. No. 5,940,275, which application is hereby incorporated by reference in its entirety.

FIELD OF THE INVENTION

This invention relates generally to PCMCIA cards and particularly to an improved PCMCIA card frame, connector and cover assembly for reinforcing the top panel of the cover assembly, insulating the top cover panel from electrical ground elements carried by the card, and closing the gaps between the connector and the top cover panel.

BACKGROUND OF THE INVENTION

Many of today's laptop, notebook, desktop and other computers, as well as computer peripherals and other electronic products are designed to receive removable devices or cards, conforming to standards established by the Personal Computer Memory Card International Association (PCMCIA). These standards define the electrical and physical specifications of the card, including the interfaces between the card and the port or slot into which the card is inserted, as well as three card form factors, called Type I, Type II and Type III. PCMCIA cards may be used for various purposes. For example, they can be used as a communications link for connecting mobile and remote portable computer users to corporate networks, the Internet and other on-line services from a wide variety of locations; to supplement the semiconductor memory of a personal or notebook computer; or to store information or data for use by the host system; or for reconfiguring the host system in response to information stored in the card.

PCMCIA cards typically include a substrate in the form of a printed circuit board (PCB) carrying electronic components including integrated circuit packages. The PCB is attached along one edge thereof to a multiple connector typically including a connector of molded plastic having multiple contacts for electrically connecting the card to the host system by way of a port or slot. A typical PCMCIA card further includes a molded plastic, insulative frame and a sheet metal cover including upper and lower cover panels enclosing the PCB and having forward margins secured to upper and lower surfaces of the plastic connector.

With the adoption of the PCMCIA low voltage, 32-bit bus mastering interface ("CardBus"), spurious ground line signals and increased electrical noise levels were encountered. To address these problems, an extra ground return in the form of a ground plate was added to the top surface of the connector. This ground plate has upwardly projecting bumps which engage ground contacts on the host computer and rearwardly extending leads connected to ground traces on the PCB. In accordance with the prior art, in order to accommodate the ground plate, a cutout is provided in the front margin of the top cover panel. A gap between the ground plate and the edges of the cutout is provided in an effort to preclude contact between the cover panel and the ground plate or the ground plate leads. However, because no support is provided for the front margin of the top cover panel cutout, the front, unsupported margin of the cover panel can be pressed down which can cause unwanted electrical contact between the cover panel and the ground plate leads, and which can also result in damage to the cover panel. Moreover, the gap between the rear of the connector and the front edge of the cover panel cutout exposes some of the internal structure of the card and, from a product design standpoint, is aesthetically unattractive.

SUMMARY OF THE INVENTION

Broadly, in accordance with the present invention, there is provided a PCMCIA card structure that fully supports the top cover panel, prevents the top cover panel from contacting the connector ground plate or the leads extending from the ground plate, and closes off the gap between the connector and the front edge of the top cover panel.

More specifically, in accordance with one embodiment of the present invention, the ground leads extending rearwardly from the ground plate are so shaped to allow a frame cross beam, molded as an integral part of the plastic, insulative frame, to fit between the ground leads and the top cover panel. This allows the cross beam of the frame to support the forward margin of the top cover panel, insulate the top cover panel from the ground plate leads and close off the gap between the back of the connector and the front edge of the top cover panel. Moreover, the transverse length of the ground plate is shorter than the transverse length of the connector. thereby exposing a shoulder surface along the upper surface of the connector adjacent each end of the connector. Laterally spaced tabs extending forwardly from the front margin of the cover panel overlap, and are bonded to, the upper end shoulder surfaces of the connector.

BRIEF DESCRIPTION OF THE DRAWINGS

Further objects, advantages and features of the invention will become evident from the detailed description below when read in conjunction with the accompanying drawings in which.

DETAILED DESCRIPTION OF THE PREFERRED EMBODIMENTS

It will be evident to those skilled in the art that although the invention is described herein with reference to an Ethernet LAN (local area network) communications card conforming to certain PCMCIA size and interface standards, the invention can be applied to cards complying with other PCMCIA size and interface standards and for performing other functions. For example, the card can serve as a modem or can combine LAN adapter and modem functions. Accordingly, the appended claims are not intended to be limited to PCMCIA cards of any specific form factor, interface or function.

Figure 1:
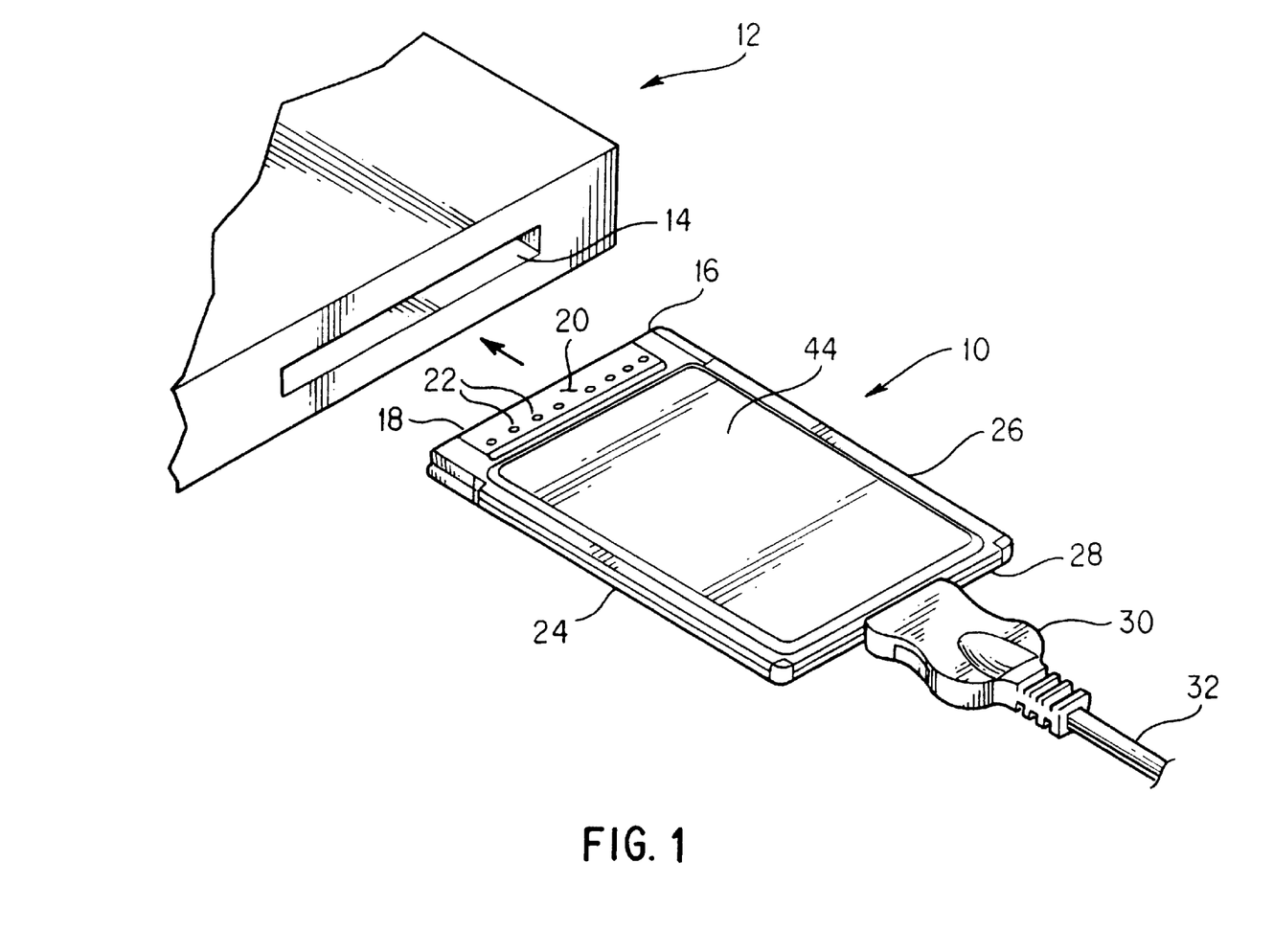
FIG. 1 is a perspective view of a PCMCIA CardBus LAN card in accordance with one embodiment of the present invention, along with a portion of a portable computer having a slot for receiving the card.
Figure 2:
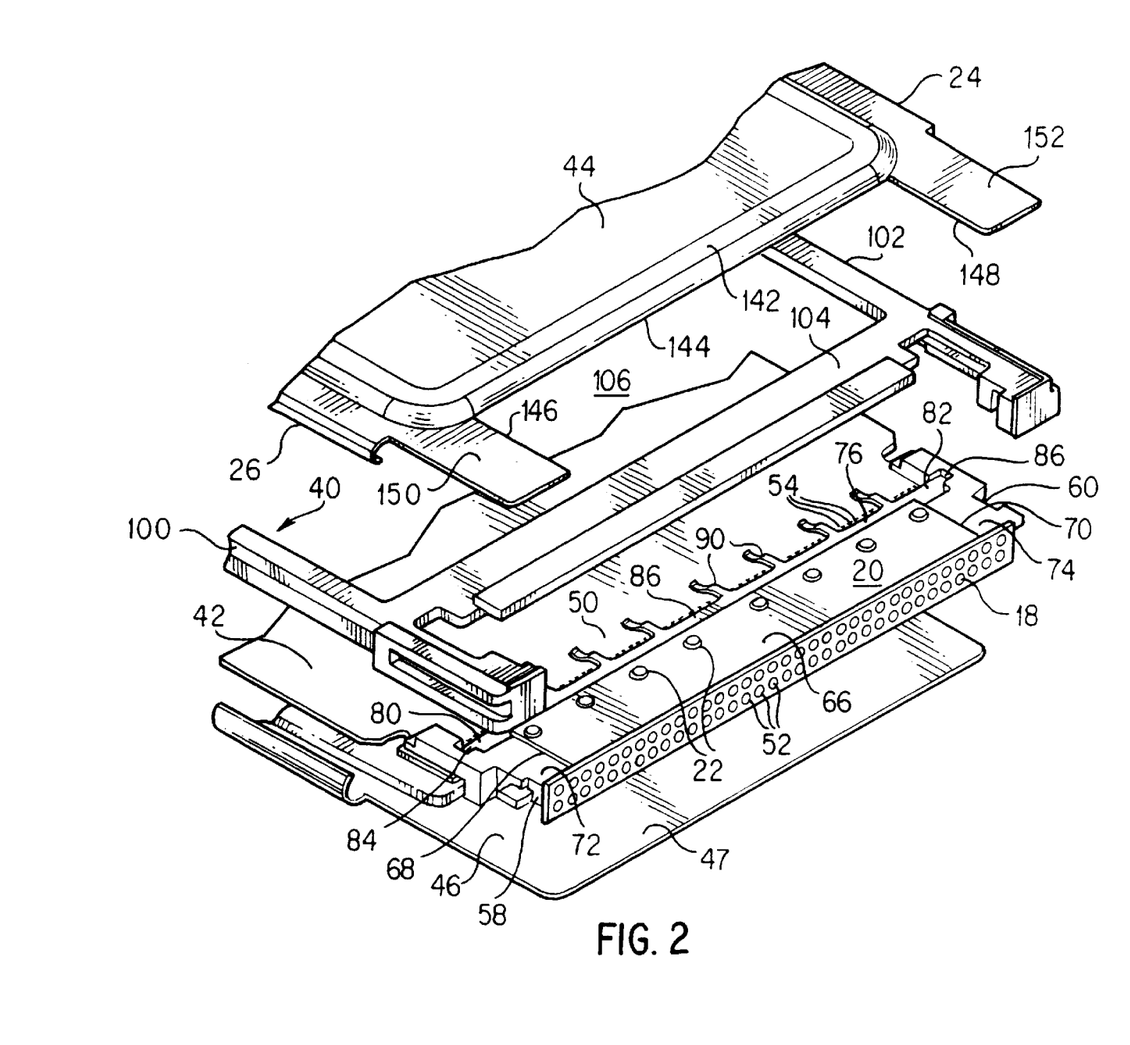
FIG. 2 is an exploded perspective view of a portion of the front of the card of FIG. 1 as seen from the top.

Referring first to FIG. 1, there is shown a generally rectangular Ethernet LAN communications card 10 incorporating the present invention. The card 10 conforms to the PCMCIA Type II (5 mm thick) and 32-bit CardBus interface standards. FIG. 1 also shows a portable host computer 12, for example, a notebook computer, having a PCMCIA port or slot 14 for receiving the LAN card 10.

Disposed along a front or forward transverse end 16 of the card 10 is a connector 18 designed to be removably coupled to a corresponding pin connector (not shown) within the slot 14. The connector pin assignments are established by the PCMCIA 32-bit CardBus interface standard. As will be described in greater detail below, a metal ground plate 20 is attached to the upper surface of the connector 18. The ground plate 20 includes ground contacts in the form of a linear array of bumps 22 projecting upwardly from the ground plate and adapted to engage corresponding ground terminals within the host computer when the card 10 is fully inserted in the slot 14. The ground plate supplements the existing ground lines and serves to eliminate spurious ground signals (including "ground bounce") and noise. (It should be noted that terms such as "top", "bottom", "upper", "lower", "vertical", and the like, are used herein only to facilitate the description of the structure of the card illustrated; it will be evident that the card may be used in any orientation.) The card 10 further has parallel, longitudinally extending sides 24, 26 and a transversely extending rear end 28. The rear end 28 of the card 10 has an input/output port for receiving a plug 30 on one end of a LAN adapter cable 32 for coupling the thin card 10 to a much larger, standard LAN receptacle or jack connected to an Ethernet network. The other end of the adapter cable 32 is thus provided with a standard male connector such as an RJ-45 modular plug (not shown). In this fashion, the card 10 and adapter cable 32 permit the personal computer 12 to be electrically and physically interfaced with an Ethernet LAN.

Figure 10:
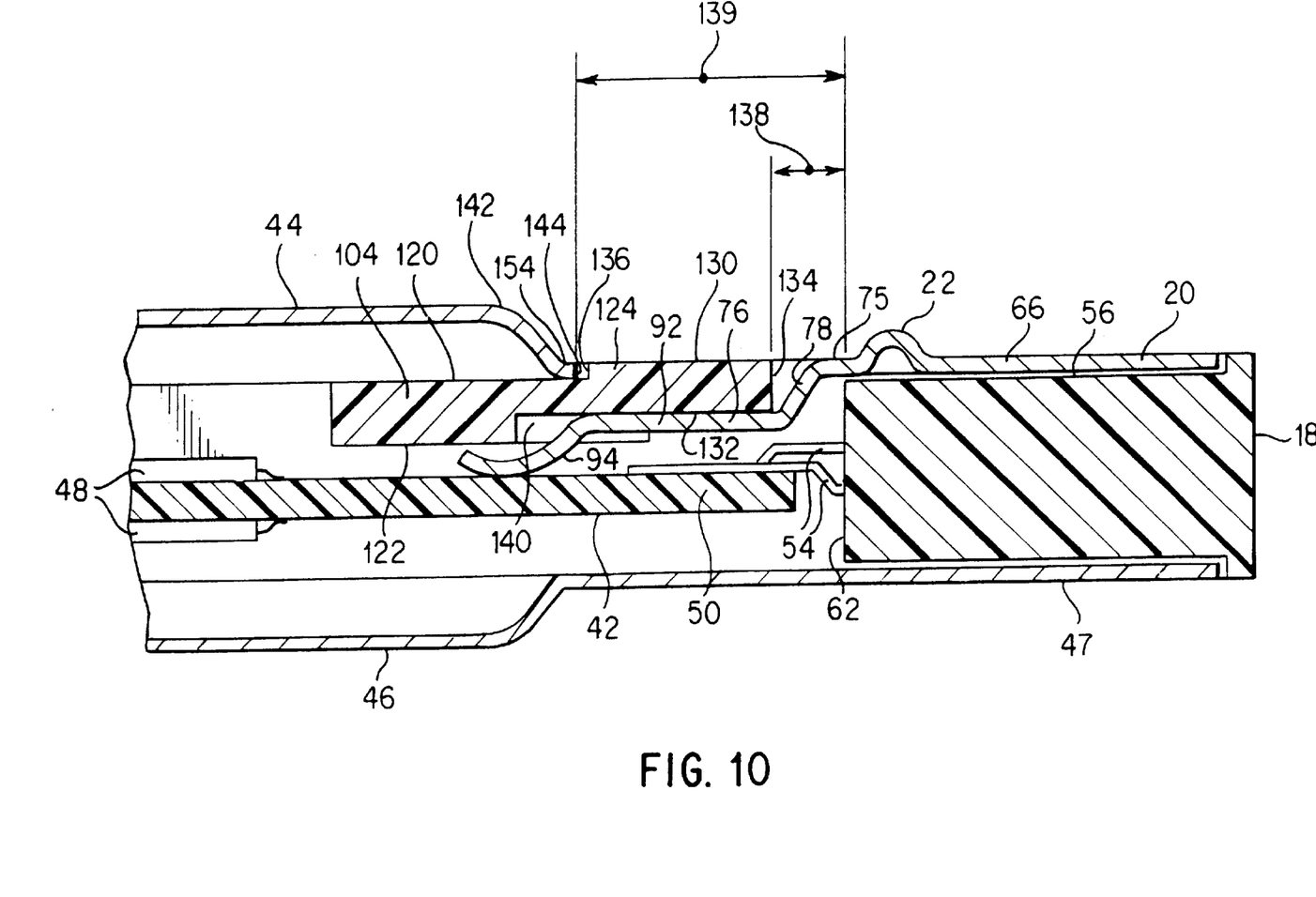
FIG. 10 is a cross section view, in elevation, of the front portion of the card of the invention, as seen along the line 10—10 in FIG. 5.
Figure 11:
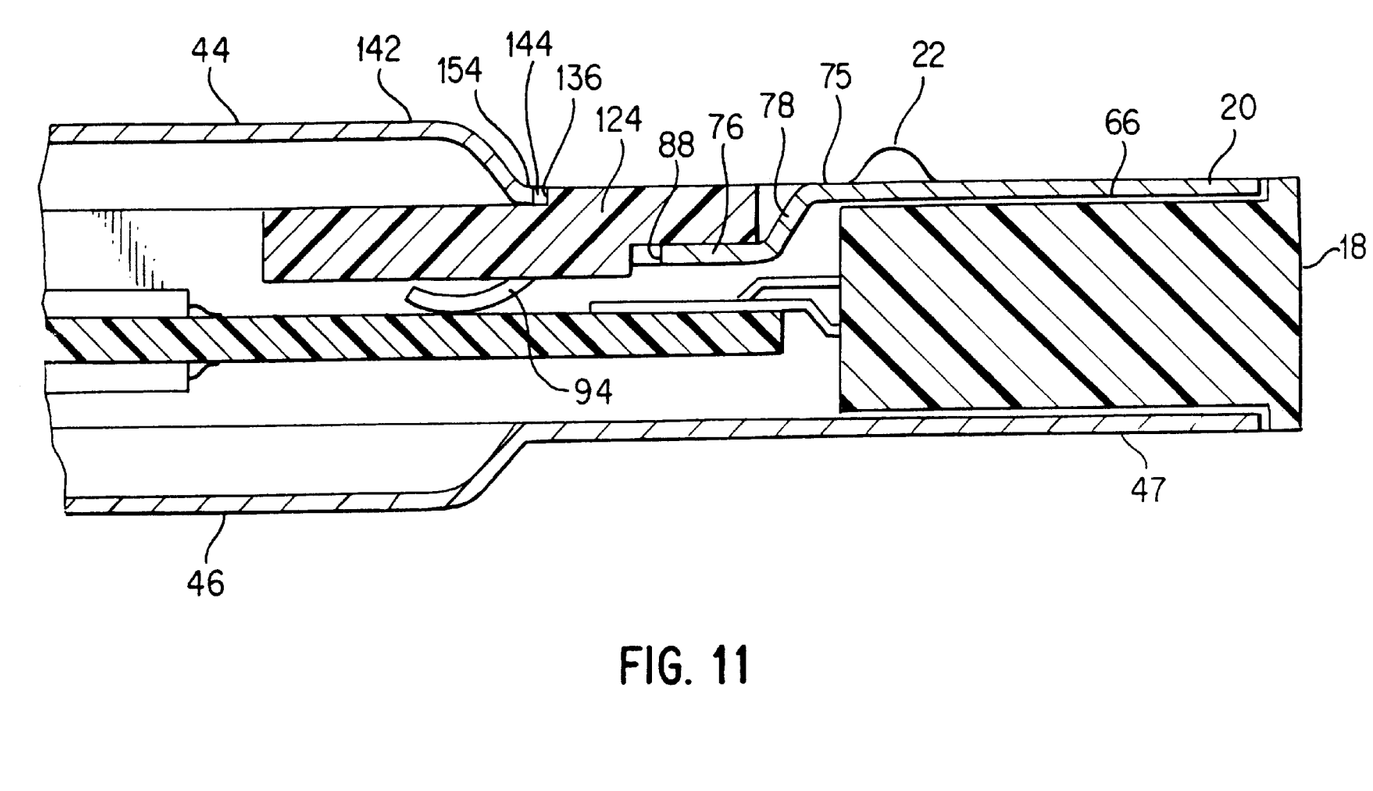
FIG. 11 is a cross section view, in elevation, of the front portion of the card of the invention, as seen along the line 11—11 in FIG. 5.

Turning now also to FIGS. 2–11, the card 10 includes, besides the front connector 18, a molded plastic frame 40, an electronic component substrate in the form of a printed circuit board (PCB) 42 supported by the frame 40, and a sheet metal cover comprising upper and lower cover panels 44 and 46, respectively. The PCB 42 supports integrated circuit and other electronic components, such as the components 48 shown schematically in FIGS. 10 and 11, for carrying out the LAN communications function, all as well known in the art. The PCB 42 has a forward terminal section 50 comprising a plurality of conductive traces which may have a standard spacing or pitch; the traces are connected to the various electronic components 48 carried by the PCB 42. The front connector 18, made of molded plastic, includes upper and lower transverse rows of longitudinally extending holes 52 each containing a contact for receiving a corresponding pin of the male connector on the host system. Each connector contact includes a rearwardly extending contact finger 54 soldered to an associated conductive trace on the terminal section 50 of the PCB 42. In accordance with the PCMCIA standard, the connector 18 has 68 contacts arranged in two rows of 34 contacts each, with the four end contacts (corresponding to pin Nos. 1, 34, 35 and 68) being assigned ground potential. The connector 18 further includes an upper, horizontal, planar surface 56, opposite ends 58 and 60, and a rear transverse side 62 from which the contact fingers 54 project. Overlying the upper surface 56 of the connector 18 is a main portion 66 of the metal ground plate 20. The main portion 66 of the ground plate 20 is shorter than the connector 18 so that opposed extremities 68 and 70 of the main portion 66 of the ground plate lie inwardly of the ends 58 and 60 of the connector 18 so that end shoulders 72 and 74 of the upper surface 56 of the connector 18 are exposed. As already mentioned, the main portion 66 of the ground plate 20 further includes a linear array of bumps 22 (eight in number in the example shown in the drawings) which engage ground potential contacts within the card-receiving slot 14 of the host system 12 when the card 10 is fully inserted. The main portion 66 of the ground plate 20 may also include a rear, cantilevered margin 75. Further, a rear, horizontal, transverse ledge 76 extends rearwardly from the margin 75 of the main ground plate portion 66. As best seen in FIGS. 10 and 11, the ledge 76 and margin 75 of the ground plate 66 are joined by an offset 78 so that the plane of the ledge 76 is below the plane of the main portion 66 of the plate 20. The ledge 76 further has ends 80 and 82 captured by recesses 84 and 86 formed in the connector 18 adjacent the connector ends 58 and 60 to help secure the ground plate 20. Extending rearwardly from a rear, transverse edge 88 of the ledge 76 is a plurality of ground spring contacts 90. In the example under consideration, eight (8) ground spring contacts 90, in longitudinal alignment with the bumps 22, are utilized. Each contact 90 comprises a horizontal, longitudinally extending portion 92 terminating in an arcuate tail 94 that engages a ground plane trace on the PCB 42. Thus, the combination of the connector 18 (including the contact fingers 54) and the ground plate 20 (including the ledge 76 and the ground spring contacts 90) may be viewed as together comprising a connector assembly that may be fabricated as a unit for attachment to the frame 40.

The generally rectangular, frame 40 comprises an integral, unitary structure molded from insulating plastic. The frame 40 includes longitudinal, parallel side rails 100 and 102 maintained in spaced apart relationship by cross beams molded integrally with the side rails 100 and 102. In this connection, the frame 40 includes a forward cross beam 104 and a rear cross beam (not shown). The frame side rails 100, 102, the forward cross beam 104 and the rear cross beam define a central, open space 106 occupied by the PCB 42. The frame side rails 100 and 102 include forwardly directed projections 108 and 110 having inner grooves 112 and 114 for mateably receiving lugs 116 and 118 on the ends of the connector 18 to secure the connector 18 to the frame 40.

The cross beam 104 includes upper and lower horizontal surfaces 120 and 122, respectively. Extending forwardly from the upper surface 120 of the cross beam 104 is a rectangular flange 124 having a transverse length equal to that of the main portion 66 of the ground plate 20. Thus, the flange 124 has longitudinally extending end edges 126, 128 in alignment with the ends 68 and 70 of the ground plate portion 66. The flange 124 further has an upper surface 130, a lower surface 132, and front and rear parallel, transverse edges 134 and 136, respectively. The front edge 134 of the flange 124 is positioned parallel with and behind the rear transverse side 62 of the connector 18, thus defining a transverse slot 138 between the flange edge 134 and the transverse side 62. As best seen in FIG. 11, the vertical thickness of the flange 124 is approximately equal to the depth of the ledge offset 78 and the forward portion of the flange 124 overlaps, in the longitudinal direction, the offset ledge 76. It will thus be seen that the offset 78 extends through the slot 138 and the ledge 76 extends under the flange 124 so that, in combination with the rear margin 75 of the ground plate 20, the slot 138 is closed off. Further, the upper surface 130 of the flange 124 is approximately coplanar with the upper surface of the main portion 66 of the ground plate 20, thereby presenting an aesthetically appealing appearance.

Figure 3:
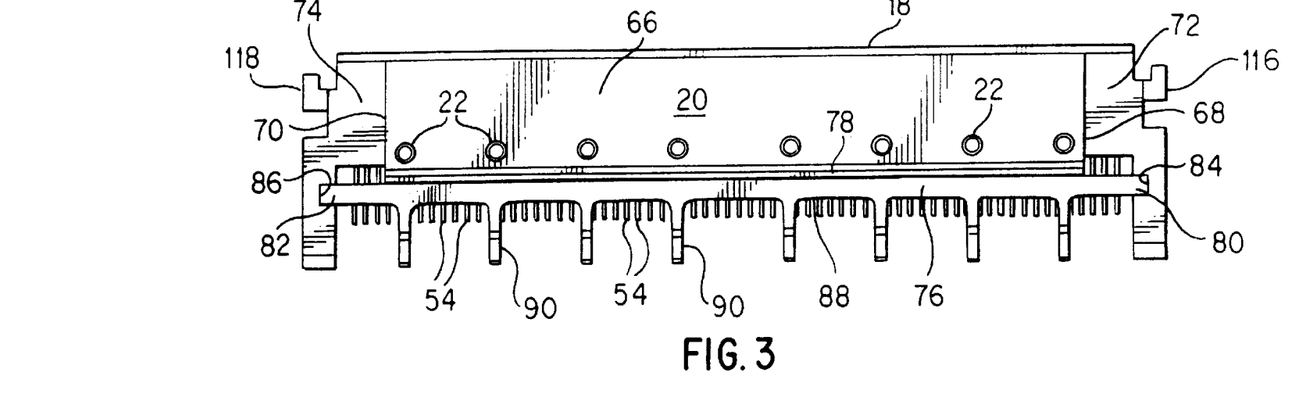
FIG. 3 is a top plan view of a subassembly of the card, the subassembly comprising the front connector block and ground plate.
Figure 4:
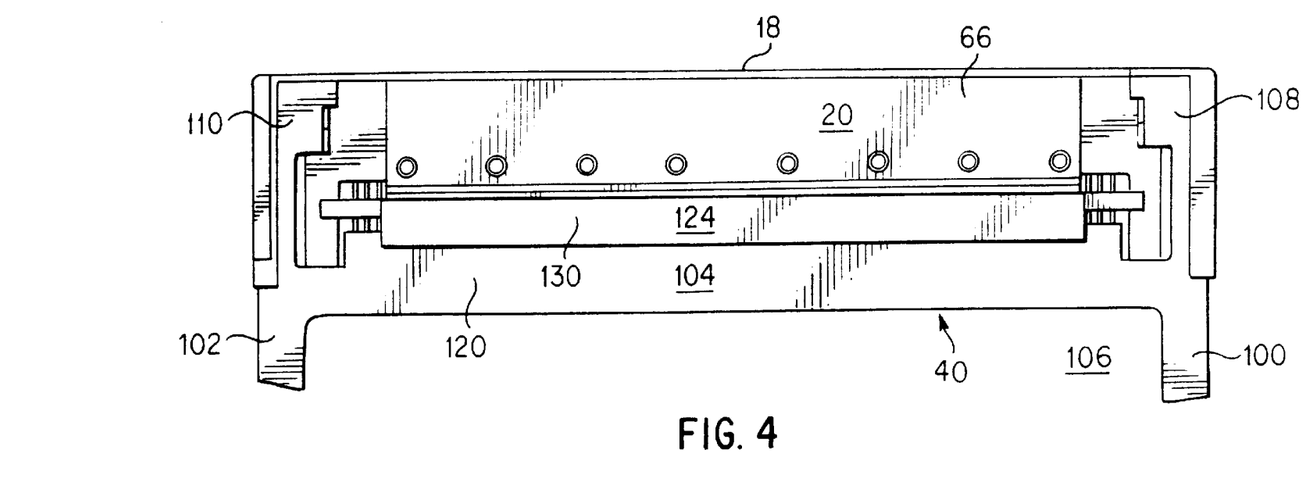
FIG. 4 is a top plan view of the subassembly of FIG. 3 showing the subassembly attached to the frame of the card.
Figure 8:
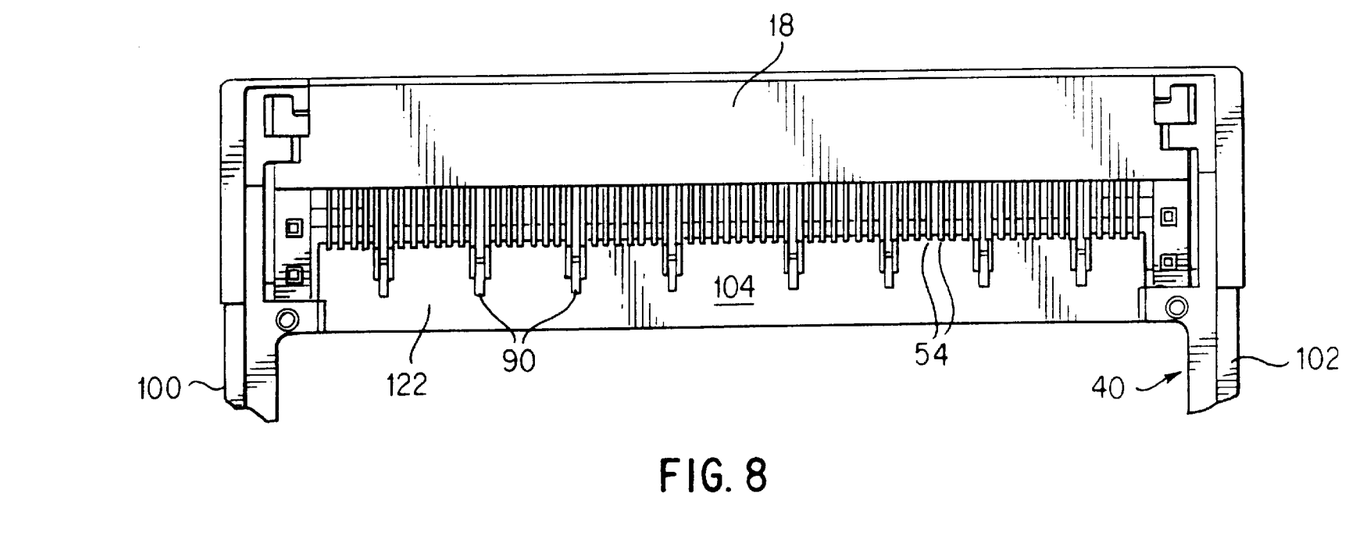
FIG. 8 is a bottom plan view of the subassembly of FIG. 7 showing the subassembly attached to the frame of the card.
Figure 9:
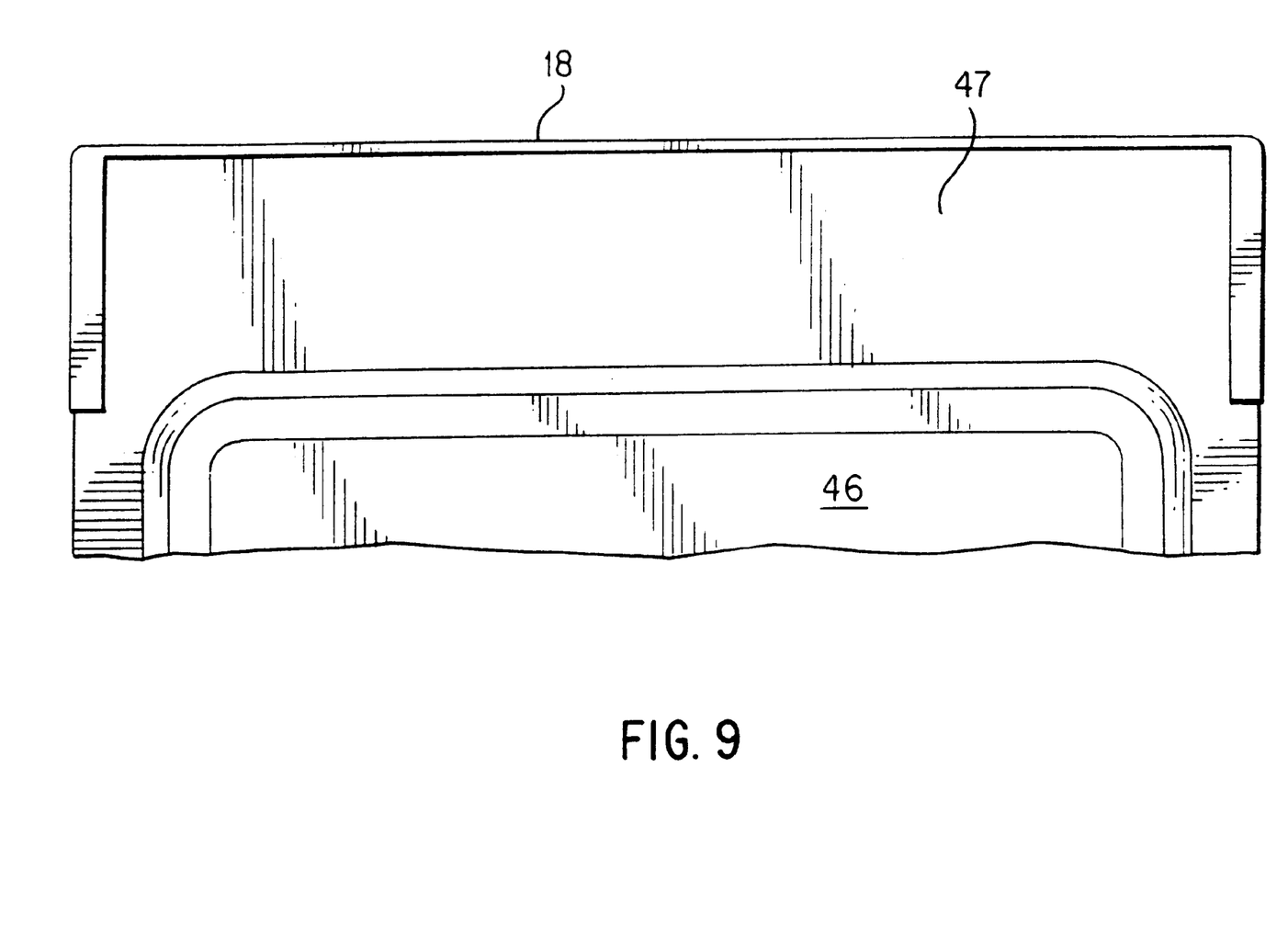
FIG. 9 is a bottom plan view of the front portion of the card along the lines of FIG. 8, showing the bottom cover panel in place.

The front portion of the lower surface 122 of the cross beam 104 is provided with a series of longitudinal channels 140 in alignment with the ground spring contacts 90. As best seen in FIGS. 3, 8 and 11, the horizontal part 92 of each ground contact 90 is received by one of the channels 140.

Figure 5:
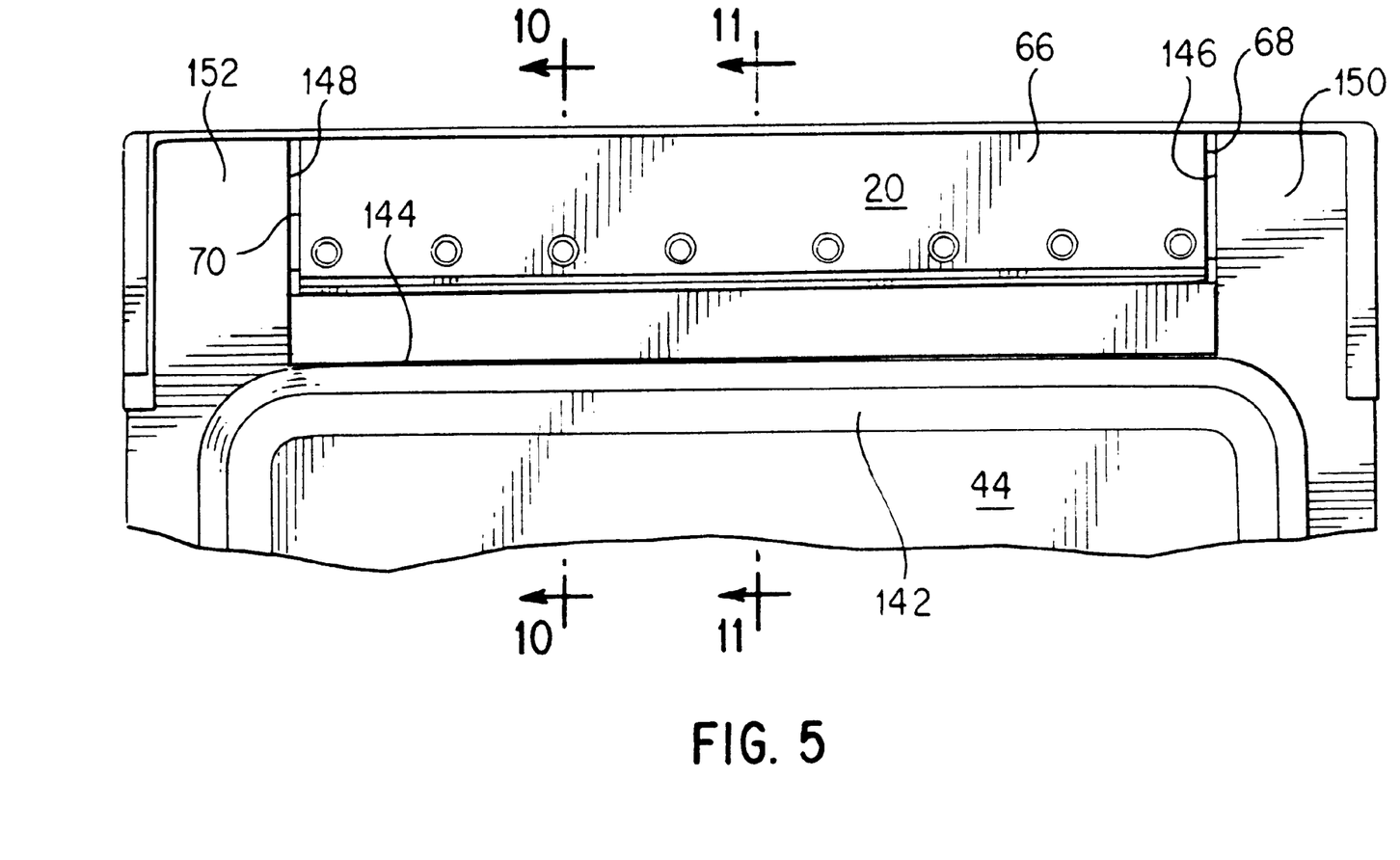
FIG. 5 is a top plan view of the front portion of the card along the lines of FIG. 4, showing the top cover panel in place.
Figure 6:
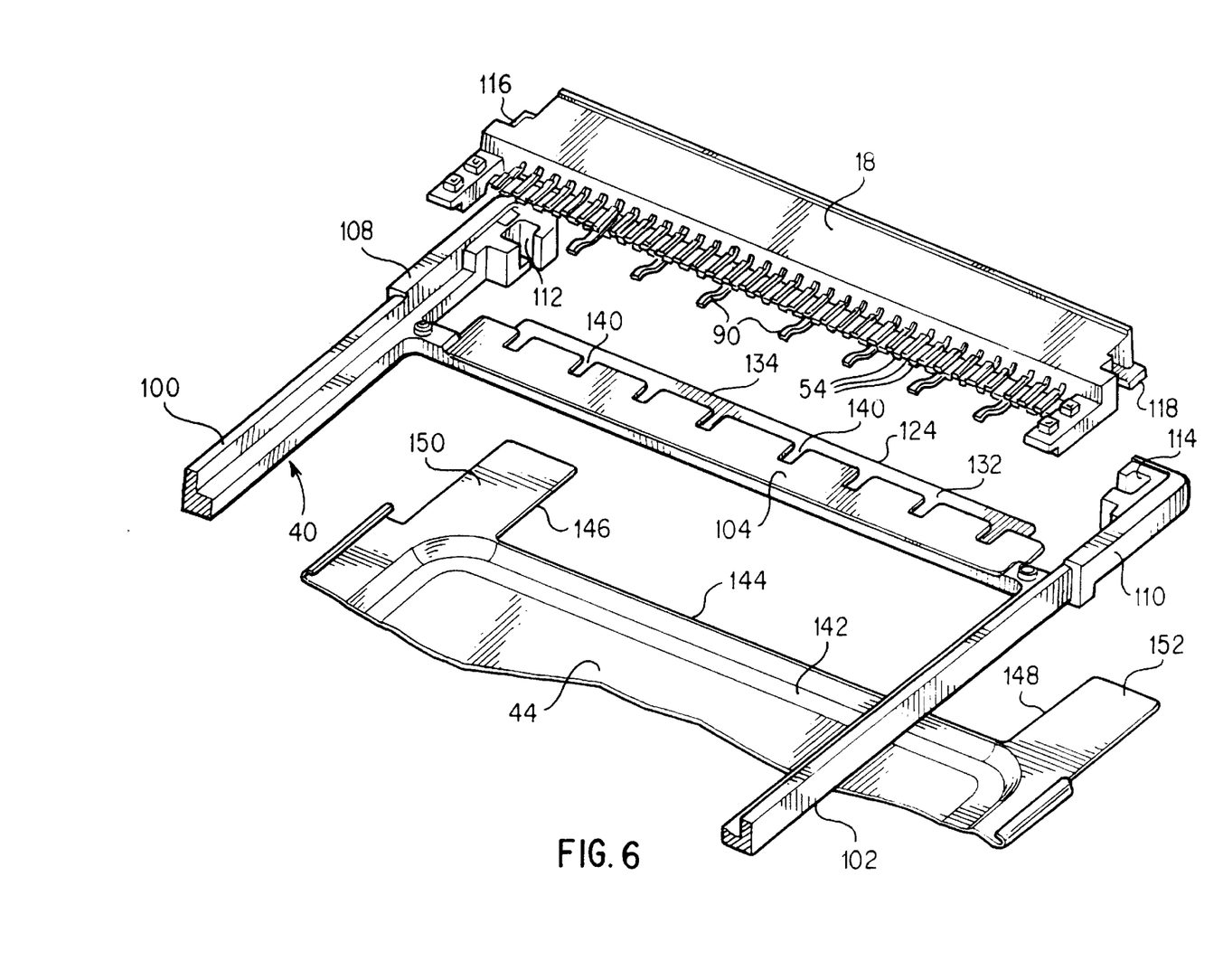
FIG. 6 is an exploded perspective view of the portion of the front of the card shown in FIG. 2, as seen from the bottom.
Figure 7:
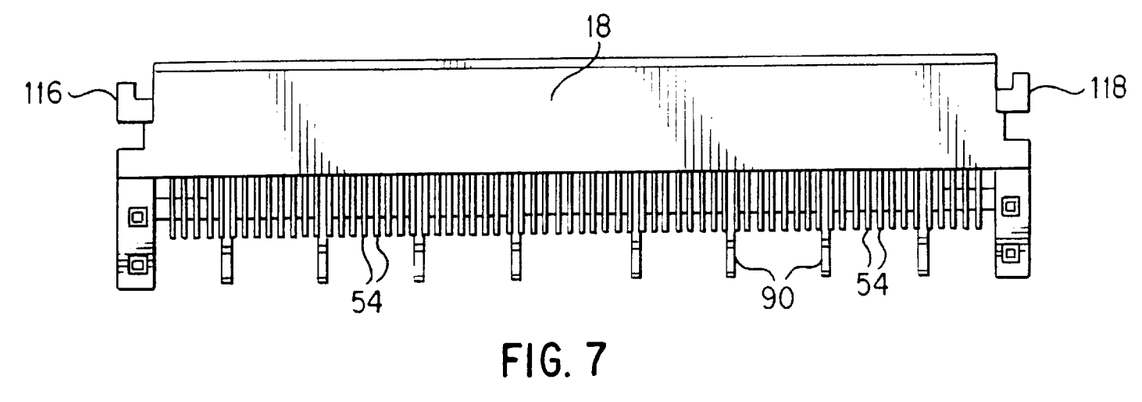
FIG. 7 is a bottom plan view of the subassembly of FIG. 3.

The top sheet metal cover panel 44 has a forward margin 142 including a central, forward transverse edge 144 extending between the inner edges 146, 148 of a pair of laterally spaced, generally rectangular, forwardly projecting side tabs 150, 152. With reference particularly to FIG. 5, the forward edge 144 of the top cover panel 44 has a transverse length approximately equal to that of the main portion 66 of the ground plate 20. The side tabs 150 and 152 overlie and are bonded to the end shoulders 72, 74 of the upper surface 56 of the connector 18 and to the projections 108 and 110 extending from the front end of the frame 40. The forward edge 144 of the top cover panel preferably terminates in a lip 154 that engages the upper surface 120 of the cross beam 104 and extends along the rear edge 136 of the flange 124. The rear edge 136 has a height approximately equal to that of the thickness of the sheet metal cover panel 44 so that the upper surface of the lip 154 is flush with the upper surface 130 of the flange 124. Further, the combination of the flange 124, the ledge 76, the offset 78 and the rear ground plate margin 75, are effective to close off the space 139 (FIG. 10) between the forward edge 144 of the top cover panel and the rear side 62 of the connector 18.

The sheet metal cover panel 46 has a forward margin 47 bonded to the lower surface of the connector block, generally in accordance with existing PCMCIA card design.

It will thus be appreciated that in accordance with the present invention, the ground leads extending rearwardly from the ground plate are so shaped to allow a frame cross beam to fit between the ground leads and the cover. This in turn allows the cross beam of the frame to support the forward margin of the top cover panel, insulate the top cover panel from the connector ground elements and close off the space between the rear side of the connector and the forward edge of the top cover panel. Moreover, because the ground plate is shorter laterally than the connector thereby exposing end shoulders along the upper surface of the connector, forwardly extending end tabs on the top cover panel overlap, and are bonded to, the exposed end shoulders of the connector and forwardly extending frame projections.

While the present invention has been described with reference to particular illustrative embodiments, the scope of the claimed invention is not intended to be restricted to those embodiments. It will be appreciated that those skilled in the art can change or modify the described embodiments, or substitute equivalent structural elements, without departing from the scope and spirit of the invention as defined in the appended claims.

What is claimed is:

1. A PCMCIA card comprising:

an insulative frame including a forward end and a transverse cross beam;

a substrate disposed within the frame, the substrate carrying electronic circuit elements;

a connector adapted to connect the card to a host system, the connector being disposed at the forward end of the frame and having contacts connected to the substrate, the connector further having a top surface and a transverse rear side;

a ground plate carried by the top surface of the connector, the ground plate having contacts connected to traces on the substrate; and a cover including a top panel, the top cover panel having a transversely extending forward edge, the forward edge of the top cover panel being spaced rearwardly of the transverse rear side of the connector, the ground plate having a rearwardly extending portion, the transverse cross beam and the rearwardly extending portion of the ground plate closing the space between the forward edge of the top cover panel and the rear side of the connector.

2. A PCMCIA card, as defined in claim 1, in which:

the forward edge of the top cover panel is supported by the transverse cross beam, the cross beam being interposed between the forward edge of the top cover panel and the substrate.

3. A PCMCIA card, as defined in claim 1, in which:

the connector has a transverse length;

the ground plate has a transverse length shorter than the transverse length of the connector, thereby defining laterally spaced apart end shoulders on the top surface of the connector; and the top cover panel includes a pair of laterally spaced, forwardly extending tabs, each tab substantially covering one of the end shoulders.

4. A PCMCIA card, as defined in claim 1, in which:

the cross beam includes a forwardly extending flange having a lower surface; and the rearwardly extending portion of the ground plate extends rearwardly along the lower surface of the cross beam flange.

* * * * *